United States Patent [19]
Cuvilliers et al.

[11] Patent Number: 4,617,586
[45] Date of Patent: Oct. 14, 1986

[54] HIGH-FREQUENCY CIRCUIT COMPRISING AN INTEGRATED CAPACITOR

[75] Inventors: Bernard Cuvilliers, Herblay; Philippe Jourdain, Evreux, both of France

[73] Assignee: U.S. Philips Corporation, New York, N.Y.

[21] Appl. No.: 477,280

[22] Filed: Mar. 21, 1983

[30] Foreign Application Priority Data

Mar. 31, 1982 [FR] France .................. 82 05551

[51] Int. Cl.⁴ .................. H01L 23/14; H01L 23/48; H01L 25/08; H01L 25/12
[52] U.S. Cl. .................. 357/80; 357/75; 357/74
[58] Field of Search .................. 357/80, 75, 74; 333/246, 247

[56] References Cited

U.S. PATENT DOCUMENTS

| | | | |
|---|---|---|---|
| 3,591,839 | 7/1971 | Evans | 357/80 |
| 4,183,041 | 1/1980 | Goel | 357/80 |
| 4,376,287 | 3/1983 | Sechi | 357/80 |
| 4,396,936 | 8/1983 | McIver et al. | 357/80 |
| 4,451,845 | 5/1984 | Philofsky et al. | 357/80 |
| 4,506,285 | 3/1985 | Einzinger | 357/80 |

OTHER PUBLICATIONS

"Active Silicon Chip Carrier"—Bodendorf et al.—IBM Technical Disclosure Bulletin—vol. 15, No. 2, 7-1972, pp. 656-657.

*Primary Examiner*—Andrew J. James
*Assistant Examiner*—S. V. Clark
*Attorney, Agent, or Firm*—Robert J. Kraus

[57] ABSTRACT

A high-frequency circuit (11) having at least a semiconductor circuit element (12) which is arranged on a first surface (13) of an insulating substrate (14). At least one (19a, 19b) of the output terminals (17, 18a, 18b, 19a, 19b) of the semiconductor circuit element (12) is electrically coupled to a ground plane (16) through a capacitive element (20) and metallized holes (21, 22). According to the invention, the circuit element (12) is secured a plate (24) of a dielectric material provided with conductive elements (27, 28a, 28b, 29a, 29b) to which the output terminals are soldered. The conductive elements to which the terminals (19a, 19b) are secured are conductively connected to a metallic layer (30a, 30b) constituting a first plate of the capacitive element (20). A conductive layer (31) formed between the plate (24) and the substrate (14) constitutes a second plate of the capacitive element.

5 Claims, 4 Drawing Figures

HIGH-FREQUENCY CIRCUIT COMPRISING AN INTEGRATED CAPACITOR

BACKGROUND OF THE INVENTION

The invention relates to a high-frequency circuit comprising at least a semiconductor circuit element which is arranged on a first surface of an insulating substrate. A second surface of this substrate located opposite to the first surface is at least partly metallized in order to form a ground plane. The semiconductor circuit element is provided with electrodes each electrically connected an output terminal. One of the electrodes, which is referred to as the first electrode, is electrically coupled to the ground plane through a capacitive element and an electrical connection with the ground plane, which is established by means of a metallized hole through the insulating substrate.

The invention is suitable for use in the field of circuits which operate in the high-frequency range and more particularly circuits comprising field effect transistors.

In the circuits known hitherto of the above-described type the semiconductor circuit element is generally arranged directly on a conductive layer formed on the first surface of the insulating substrate. The output terminals of the semiconductor circuit element are then connected through wires to the other circuit elements of the circuit. In particular, this is the type of electrical connection between the first electrode and the capacitive element. Providing the wiring is an operation which must be effected with great care and which, especially when a large number of output terminals is present, is timeconsuming and hence expensive. Unfortunately, with this known technology, a good reproducibility of the electrical connections is not always obtained.

SUMMARY OF THE INVENTION

It is an object of present invention to obviate this disadvantage by minimizing the use of wiring at the level of the output terminals of the semiconductor circuit element.

According to the invention, such a high-frequency circuit is characterized in that the semiconductor circuit element is secured on an intermediate connection element comprising a plate of a dielectric material having conductive elements disposed on a first surface, to which the output terminals of the semiconductor circuit element are directly soldered. At least one of the conductive elements is electrically connected to a conductive layer on the first surface of the plate, which constitutes a first electrode of the capacitive element. A second surface of the plate, which is located opposite to the first surface, disposed on a conductive layer on a first surface of the insulating substrate. The conductive layer contacts at least one metallized hole and constitutes the second plate of the capacitive element. By directly securing the semiconductor circuit element by soldering the output terminals to the conductive elements on the intermediate connection element, interconnection by means of wiring is prevented.

On the other hand, the invention provides the possibility of a simpler manipulation of the semiconductor circuit element so that it can be arranged on an intermediate connection element whose dimensions can be considerably larger than those of the circuit element itself; consequently, the circuit element can be tested more readily before the connection element is secured on the insulating substrate. Finally, the invention further provides the possibility of completely integrating the capacitive element, the intermediate element then serving at the same time as dielectric for the capacitive element.

In a preferred embodiment of the invention, the semiconductor circuit element is a field effect transistor and the first electrode is electrically connected to the source zone of the field effect transistor. In fact, when the use of wires for the connection between the source zone and the ground plane is avoided, the impedance, which is always unfavourable and which is introduced by the wires, can be eliminated. In applications, where the capacitive element should have high capacitance, the dielectric material of the intermediate wiring board preferably has a dielectric constant between 600 and 2000.

In order to reduce the capacitance of the conductors, a recess is provided in the conducting surface opposite to the semiconductor element.

When the semiconductor circuit element is a field effect transistor, the possibility of connecting the source zone to the ground plane through a capacitive element of high capacitance enables a high-frequency circuit to be easily provided. In such a circuit the source zone of the field effect transistor is capacitively coupled at high frequencies, to earth through the intermediate element. A resistor of fixed value, arranged in parallel with the capacitive element, connects the source zone to earth at low frequencies, The current and the voltage of the field effect transistor are adjusted through a stabilization circuit so that the working point is independent of the field effect transistor.

BRIEF DESCRIPTION OF THE DRAWING

The invention will now be described more fully with reference to the accompanying drawing, in which.

DESCRIPTION OF THE PREFERRED EMBODIMENT

Figure 1:
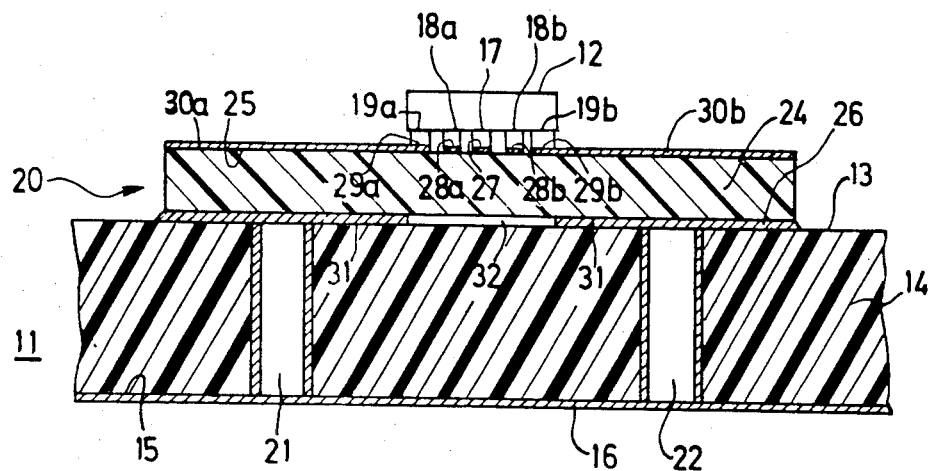
FIG. 1 is a sectional view of a high-frequency circuit according to the invention.

FIG. 1 is a sectional view of a high-frequency circuit 11 provided with a semiconductor circuit element 12, which in the embodiment of FIG. 1 is a field effect transistor made, for example, of gallium arsenide. This transistor 12 is arranged adjacent a first surface 13 of an insulating substrate 14 of, for example, aluminium oxide. A second surface 15 of this substrate, which is located opposite to the first surface 13, is metallized at least in part in order to form a ground plane 16. The field effect transistor 12 is provided with electrodes which contact the drain, the gate and the source zones and is provided with output terminals 17, 18a, 18b, 19a, 19b. In the embodiment shown in FIG. 1, the terminal 17 contacts the drain electrode of the transistor, while the terminals 18a and 18b contact the gate electrodes and the terminals 19a and 19b contact the source zone electrodes. One of the electrodes of the transistor, in the case of FIG. 1 that of the source zone, is intended to be electrically coupled to the ground plane 16 through a capacitive intermediate 20, the coupling to the ground plane 16 being partly realized through two metallized holes 21, 22 through the insulating substrate 14. As can be seen in FIG. 1, the field effect transistor 12 is secured on an intermediate element which consists of a plate 24 of a dielectric material having on a first surface 25 conductive elements 27, 28a, 28b, 29a, 29b, on which the output terminals 17, 18a, 18b, 19a and 19b of the electrodes of the field effect transistor are directly soldered. Elements 29a and 29b, connected through the output terminals 19a and 19b to the source zone, are electrically connected to a metallic layer 30a, 30b deposited on the first surface 25 of the plate 24, which constitutes a first plate of the capacitive intermediate element 20. A second surface 26 of the plate, located opposite to the first surface 25, is disposed on a conductive layer 31, which is formed on the first surface 13 of the insulating substrate 14. The conductive layer 31 adjoins the metallized holes 21 and 22 to effect electrical continuity with the ground plane 16. As is appararent from FIG. 1, the conductive layer 31 constitutes a second plate of the capacitive element 20. A recess 32 is provided in the conductive layer 31 opposite to the semiconductor circuit element 12 in order to reduce the capacitance of the conductors.

Figure 2:
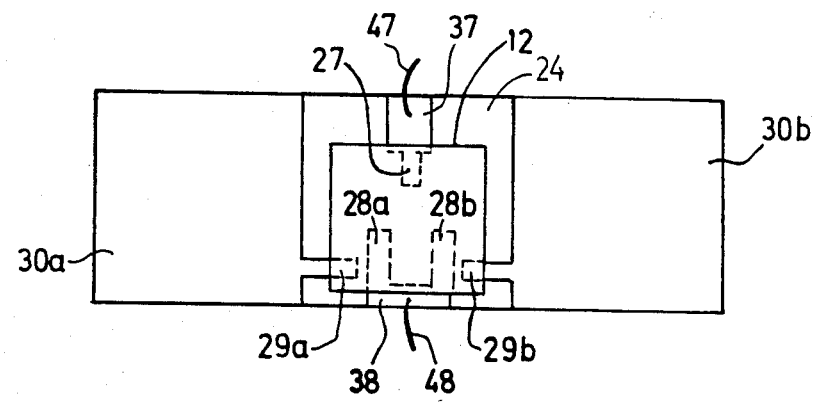
FIG. 2 is a plan view of the intermediate element of a circuit according to the invention.

FIG. 2 is a plan view of the plate 24 and shows the arrangement of the conductive elements 27, 28a, 28b, 29a, 29b and of the metal layers 30a and 30b. As is shown in FIG. 2, the element 27 extends into a metallic track 37, while the elements 28a, 28b are connected to another metal track 38. The drain zone and the gate of the field effect transistor 12 can be connected through these tracks 37 and 38, respectively, to other circuit elements by means of the wires 47 and 48.

Figure 3:
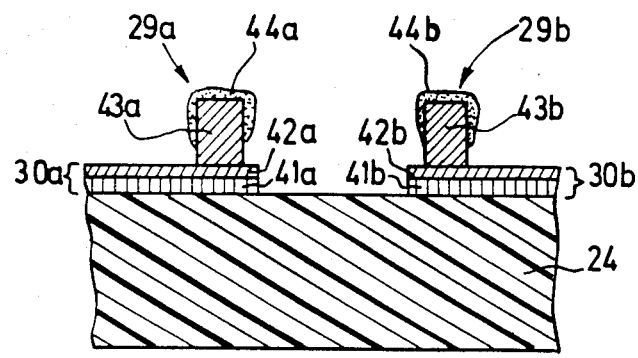
FIG. 3 is a sectional view of an embodiment of the metallized surface and of the metal elements deposited on the first surface of the intermediate element.

FIG. 3 is a partial sectional view of the intermediate element 20, which figure shows an embodiment of the metallic layers 30a and 30b and of the conductive elements 29a and 29b; only these are represented for the sake of clarity. The plate 24 has first formed on it by photo-etching the surfaces 30a and 30b as well as the tracks 37, 38 after deposition of a first sublayer 41a, 41b, obtained by cathode sputtering of nickel, chromium and gold and after the subsequent formation of a second sublayer 42a, 42b of gold deposited electrolytically. During a second photo-etching step, the conductive elements 29a and 29b are formed by the successive electrodeposition of protuberances 43a, 43b of copper and of tin-iodine solder layers 44a, 44b.

Figure 4:
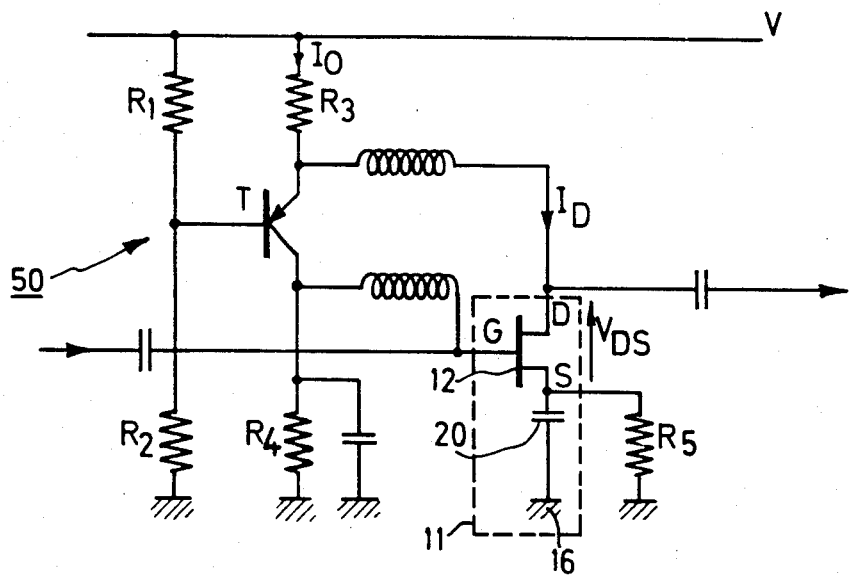
FIG. 4 shows the circuit diagram of an embodiment of a high-frequency circuit according to the invention, in which a field effect transistor is used.

FIG. 4 shows the circuit diagram of an embodiment of the high-frequency circuit 11 according to the invention for operating the field effect transistor 12. In this embodiment, the source zone S of the transistor is connected to the ground plane 16, for the high frequencies, through the capacitive element 20, which must have a high capacitance. For this reason it is favourable that the dielectric material of the intermediate element 20 has a high dielectric constant between 600 and 2000. Among the materials that can be used are glass, ceramic material and barium titanate. A polarization resistor R5 electrically connected in parallel with the capacitive element 20 so that in co-operation with the stabilization circuit 50 a working point for current and for voltage can be defined which is independent of the field effect transistor.

In the presence of the bipolar transistor T, the stabilization circuit 50 keeps the current $I_D$ through the field effect transistor 12 substantially constant. Since the drain zone potential is fixed, the potential difference $V_{DS}$ between the drain zone and the source zone consequently is also substantially constant. The working point for current $I_D$ and for voltage $V_{DS}$ of the field effect transistor is therefore adjusted independently of the dispersion existing between the transistor of the same kind and more particularly of the sometimes large dispersion of the potential difference $V_{GS}$ between the gate G and the source zone S. By way of example, the numerical values of the main parameters of the circuit of FIG. 4 are as follows.

V = 8 V
R1 = 2700Ω
R2 = 6200Ω
R3 = 180Ω
R4 = 2200 Ω
R5 = 330Ω

The invention is not limited to the embodiment of a field effect transistor shown in FIGS. 1 and 2. As a matter of course, the invention may also be realized by means of other circuit elements, such as bipolar transistors or diodes.

What is claimed is:

1. A high frequency circuit arrangement comprising a semiconductor circuit element having a plurality of terminals secured to an insulative substrate having opposing first and second surfaces bearing conductive means for interconnecting circuit elements, characterized in that said circuit arrangement comprises:
   a. a first conductive layer on the first surface of the substrate;
   b. a second conductive layer on the second surface of the substrate, said second conductive layer forming a ground plane;
   c. a conductively-coated wall defining a hole through the substrate extending between the first and second surfaces, said wall electrically connecting the first and second conductive layers;
   d. a semiconductor-mounting dielectric plate having opposing first and second surfaces, said plate being secured to the substrate with its second surface physically contacting the first conductive layer and with its first surface bearing:
      1. a third conductive layer overlying at least part of the first conductive layer; and
      2. a plurality of conductive elements positioned to make electrical connection with respective ones of the terminals on the semiconductor circuit element, at least one of said conductive elements being electrically connected to the third conductive layer;
   said first and third conductive layers forming with the dielectric plate an integrated capacitor for co-operating with the conductively-coated wall and with the at least one conductive element to AC couple the respective terminal of the semiconductor element to the ground plane.

2. A high frequency circuit arrangement as in claim 1 where the semiconductor circuit element comprises a field effect transistor and where the at least one conductive element is electrically connected through the respective terminal to the field effect transistor's source zone.

3. A high frequency circuit arrangement as in claim 1 or 2 where the dielectric plate has a dielectric constant between 600 and 2000.

4. A high frequency circuit arrangement as in claim 1 or 2 where the first conductive layer includes a recess disposed opposite to the terminals of the semiconductor circuit element to minimize capacitive coupling of said terminals to said first conductive layer.

5. A high frequency circuit arrangement as in claim 2 including a resistor electrically connected in parallel with the integrated capacitor and a stabilization circuit electrically connected to the field effect transistor and the ground plane for controlling the drain current and voltage of the field effect transistor.

* * * * *